United States Patent
Ayotte et al.

(10) Patent No.: US 8,426,856 B2
(45) Date of Patent: Apr. 23, 2013

(54) THERMALLY SENSITIVE MATERIAL EMBEDDED IN THE SUBSTRATE

(75) Inventors: Stephen P. Ayotte, Burlington, VT (US); Kristen L. Holverson, Williston, VT (US); Timothy M. Sullivan, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 12/834,110

(22) Filed: Jul. 12, 2010

(65) Prior Publication Data

US 2012/0007074 A1    Jan. 12, 2012

(51) Int. Cl.
*H01L 23/34*    (2006.01)
*H01L 21/66*    (2006.01)

(52) U.S. Cl.
USPC .......................................................... 257/48

(58) Field of Classification Search ............ 257/40, 257/98, 642–643, 759, E39.007, E51.001–E51.052, 257/E27.117–E27.119, E23.08, E21.53; 438/789–794, 963–964, 974, 82, 99, 16
See application file for complete search history.

(56) References Cited

U.S. PATENT DOCUMENTS

| | | | |
|---|---|---|---|
| 4,298,348 A | 11/1981 | Ivory | |
| 5,085,801 A * | 2/1992 | Thierry et al. | 252/408.1 |
| 7,004,621 B2 | 2/2006 | Roberts et al. | |
| 7,513,682 B2 * | 4/2009 | McClure et al. | 374/5 |
| 2005/0254551 A1 | 11/2005 | McClure et al. | |
| 2007/0218206 A1 | 9/2007 | Reichert et al. | |
| 2009/0289359 A1 * | 11/2009 | Jang et al. | 257/737 |

FOREIGN PATENT DOCUMENTS

JP    6347341    12/1994

* cited by examiner

*Primary Examiner* — Dao H Nguyen
*Assistant Examiner* — Tram H Nguyen
(74) *Attorney, Agent, or Firm* — Gibb & Riley, LLC; David A. Cain, Esq.

(57) ABSTRACT

A structure and methods for using an integrated circuit structure comprise a substrate and circuitry connected to the substrate. The substrate includes a heat sensitive material that changes color when heated. The heat sensitive material has one of a plurality of colors depending upon a temperature to which the substrate was exposed.

17 Claims, 2 Drawing Sheets

THERMALLY SENSITIVE MATERIAL EMBEDDED IN THE SUBSTRATE

BACKGROUND

The present invention relates to embedding a thermally sensitive material into an organic substrate supporting semiconductor circuits, and more specifically, to a thermally sensitive material that permanently changes color when the substrate is subjected to a particular temperature during a manufacturing process.

Organic substrates used for semiconductor module manufacturing are sensitive to exposure to excessive temperature. When exposed to excessively high temperature, the result may have negative effects on the product quality, performance and reliability when processed through assembly. All parts are qualified to a maximum temperature they can be exposed to and still function properly.

The materials currently used for organic packaging are sensitive to the maximum temperature associated with processing. Minimum temperatures are required to make a good assembly solder joint, however, misprocessing by overheating may result in semiconductor module failure. Industry specifications have been written by JEDEC Solid State Technology Association to specify the maximum exposure to certain temperature conditions.

All of the internal qualifications are performed to determine the maximum exposure temperature and the number of times parts can be exposed to those temperatures. Excessive exposure to high temperature can result in immediate or time dependent failure. Most process steps are designed to ensure compliance.

The most heat intensive operation occurs when failed semiconductor modules are removed from modular assemblies for off-line failure analysis. However, excessive temperature at this modular removal step may cause failure modes of the failed semiconductor modules which have nothing to do with the original failure.

Because it is not always possible to know exactly the temperature which parts are exposed to, it is difficult to ascertain the true failure mechanism and root cause. Therefore, temperature exposure must be controlled and more thoroughly monitored at all processing steps. There is no current method to record and visually show the level of temperature to which a part has been exposed.

SUMMARY

According to one embodiment of the present invention, an integrated circuit structure includes a substrate, circuitry connected to the substrate, and a heat sensitive material within the substrate including a polydiacetylene compound. The heat sensitive material permanently changes to one of a plurality of colors when heated depending upon a maximum temperature to which the substrate was exposed.

The heat sensitive material may be positioned on the substrate at a location that is visible from an exterior of the integrated circuit structure, and changes color when a predetermined temperature is exceeded, the predetermined temperature being determined to cause damage to the integrated circuit structure. The heat sensitive material may be positioned in a portion of the substrate or within all of the substrate. The integrated circuit structure includes an organic substrate.

Another embodiment of the invention includes determining source materials to be used when forming integrated circuit structures on a substrate, and evaluating the source materials to find temperatures at which the source materials may become damaged. A heat sensitive material is selected that changes color when heated, based on the temperature at which the heat sensitive material will change color. The temperature at which the heat sensitive material will change color may coincide with the temperature at which the source material may become damaged. The substrate is formed using the heat sensitive material and the substrate is subjected to heat processing to form the integrated circuit structures. The heat sensitive material permanently changes to one of a plurality of colors depending upon a maximum temperature to which the heat sensitive material is exposed, and the selection of the heat sensitive material includes choosing the heat sensitive material that changes color at a temperature that may damage the source materials.

DETAILED DESCRIPTION

For the first time ever in semiconductor manufacturing, both leaded and lead-free parts may be assembled on the same manufacturing line resulting in an increased probability of the leaded parts being exposed to excessive temperatures thereby causing failure of the leaded electrical connections. A combination of a colorimetry indicator and an irreversible indicator provides for continuous monitoring of product quality through different phases of manufacturing and customer use. Parts returned by customers for failure analysis that have indications of exposure to excessive temperature can be quickly determined if the excessive temperatures were induced by the customer (if the part had no indication of excessive temperature at the time the part was delivered to the customer). Until the embodiments presented herein, there was no way of knowing if excessive temperature failure was induced by the manufacturer or the customer and where the excessive temperature was induced.

Figures 1A, 1B, 1C:
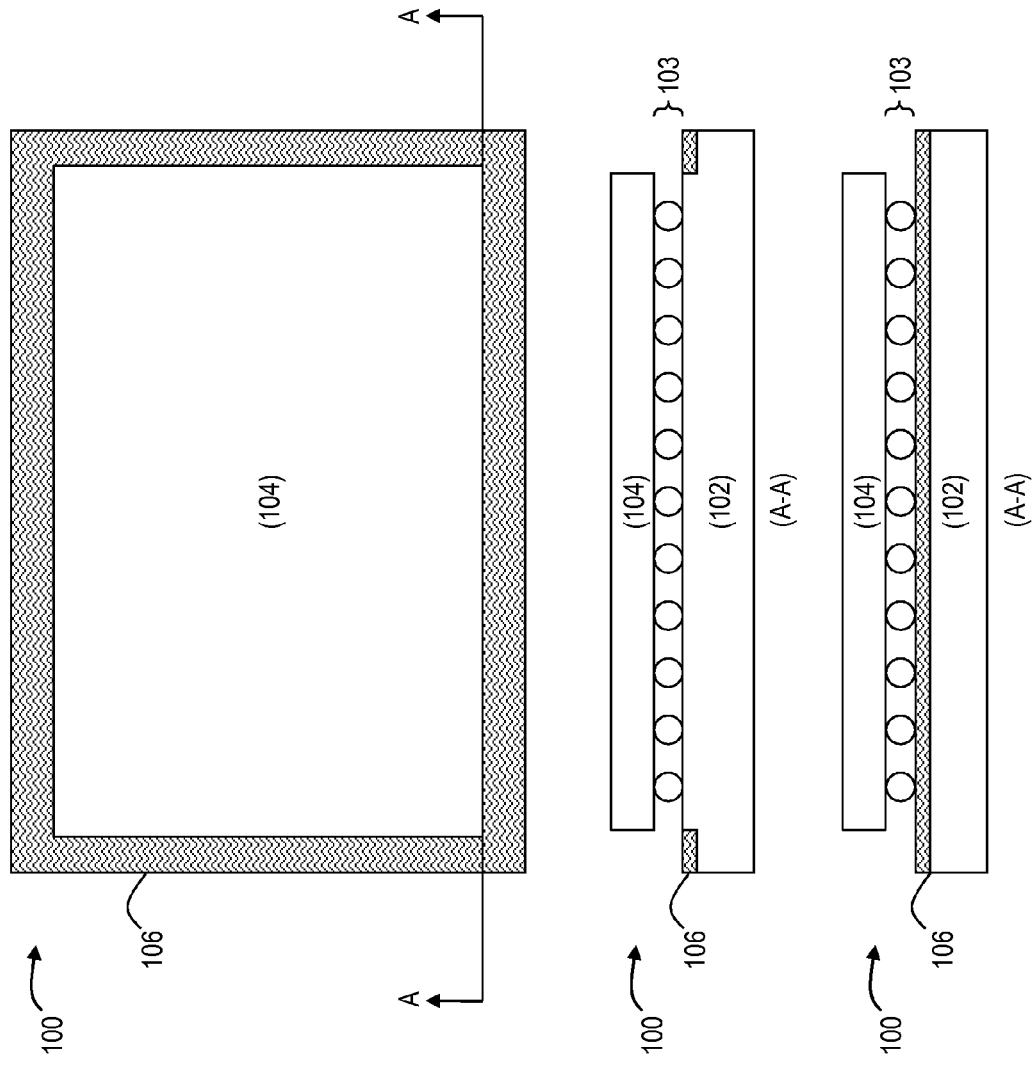
FIG. 1A is a schematic plan view diagram of embodiments herein.
FIG. 1B is a cross-sectional side view schematic diagram along line A-A from FIG. 1A of embodiments herein.
FIG. 1C is an alternative embodiment of a cross-sectional side view schematic diagram along line A-A from FIG. 1A of embodiments herein.

FIGS. 1A, 1B, and 1C illustrate an apparatus 100 that includes an organic substrate 102 (FIGS. 1B and 1C) upon which a layer of solder balls 103 supports and connects a semiconductor module 104 to the organic substrate 102. The layer of solder balls 103 may alternatively be replaced with wirebonding, (not shown) to join and support the semiconductor module 104 to the organic substrate 102. Embedded in a top portion of the substrate 102 is a temperature dependent coating 106 that permanently changes colors when the coating 106 rises above a predetermined temperature. FIG. 1B illustrates an embodiment where the temperature dependent coating 106 is only deposited in a portion of the organic substrate, specifically, around the periphery of the semiconductor modules 104, whereas FIG. 1C illustrates an alternative embodiment where the temperature dependent coating 106 is deposited across the entire surface of the organic substrate 102.

The temperature dependent coating 106 is embedded into the organic substrate 102 to act as a temperature indicator material that changes color as a function of exposure to a particular temperature. Based upon the color of the embedded material, a visual inspection can be performed to sort parts with acceptable process history versus those that have suffered degraded product quality. For example, parts showing a first color of the temperature dependent coating 106 would be accepted as not reaching a particular maximum design process temperature, while parts showing a second permanent color of the temperature dependent coating 106 would be not accepted, as the second permanent color indicates a part has reached a particular maximum design process temperature. The visual appearance of the second color change is irreversible so that once the part has been exposed to a maximum design temperature an immediate disposition may be made with respect to the color of the part. An inspection can be performed at any point in the manufacturing process to visually determine if the part has been exposed to an unacceptably high temperature based on the color change of the temperature dependent coating 106.

Correct choice of materials is made such that there is no degradation of module quality. Materials may be chosen from polydiacetylene compounds such as those identified in U.S. Pat. No. 5,085,801, that instantaneously and irreversibly changes from blue to red at a threshold temperature. As explained in U.S. Pat. No. 5,085,801, (incorporated herein by reference) a family of diacetylenic monomers has now been found which, on polymerization, produce polymers undergoing an irreversible color change from blue to red at a given temperature.

Certain diacetylenes have the characteristic of polymerizing in the solid state, generally due to a thermal effect, where an intense color appears during polymerization. In general, this coloration is due to the strong delocalization of the pi electrons along the polymer chain through overlapping of the pi orbitals of the carbons.

It has been possible to establish a relationship between the color of the polymer and the conjugation length of polymerization. A blue color appears if the polydiacetylenic chains are planar and rigid, where the conjugation lengths are greater than about thirty monomer units. If the chains are partially planar or periodically interrupted, i.e., if the conjugation length decreases, the polymer becomes red.

The blue color is already apparent at low degrees of polymerization (of the order of one per cent). In the remainder of the present description, the term "polydiacetylene compound" will denote all the blue-colored products, whether they are pure polymers or polymer/monomer mixtures, even when the proportion of polymers is low.

During an increase in temperature of the polydiacetylene compound obtained, the fusion of the side-groups on the polydiacetylenic chain gives this chain a degree of mobility. This results in a loss of planarity of the chain, i.e. a reduction in the conjugation length, which manifests itself by a profound modification of the absorption spectrum, the absorption band at 600-650 nm tending to disappear.

This thermodynamic transition, which induces a color change in the polydiacetylene compound, has been shown to correspond to the fusion of the alkyl chains on the polymer. Furthermore, this color change or transition, which is actually equivalent to a decrease in the order of the polymer system, is irreversible.

A new family of polydiacetylene compounds has therefore been selected which exhibit a particular thermochromic behavior, namely an irreversible color change from blue to red which takes place at a given temperature specific for the length of the alkyl chain on the starting monomer. These polydiacetylene compounds can be used as temperature indicators.

Figure 2:
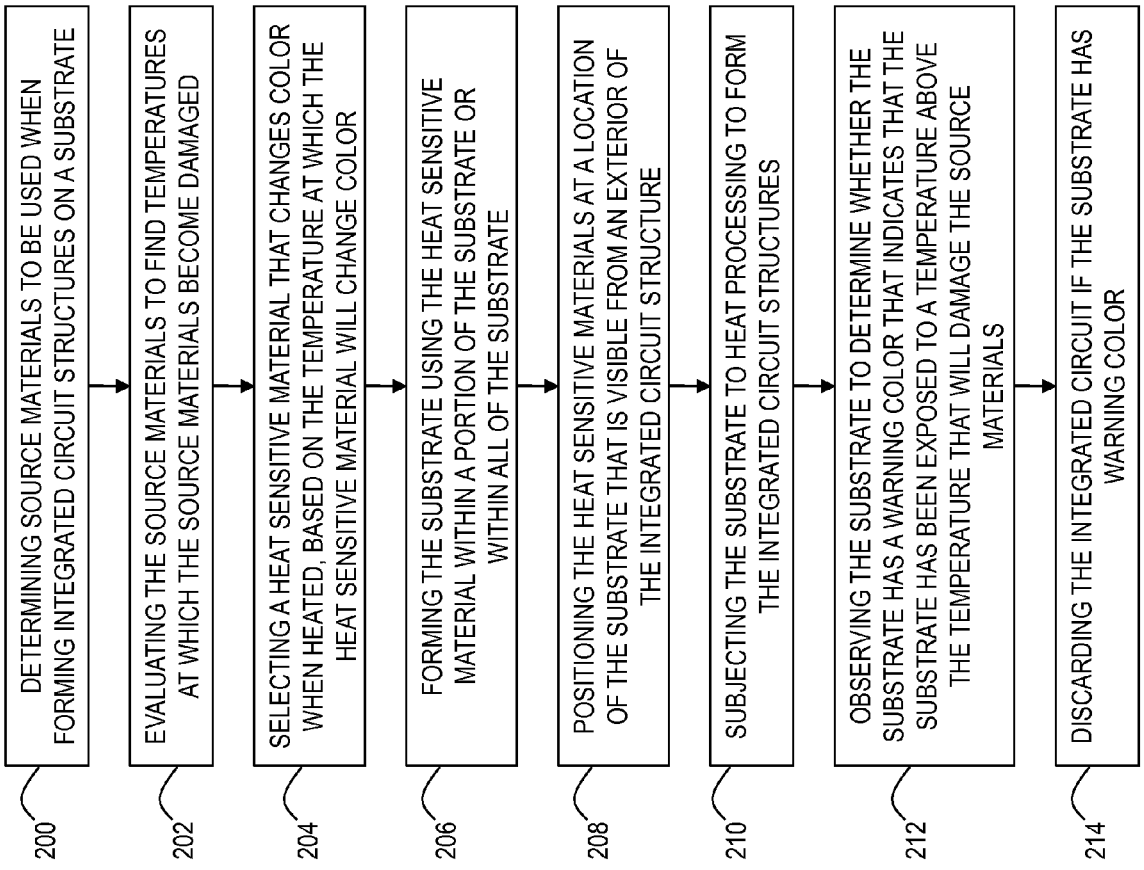
FIG. 2 is a flow diagram of methods utilized by embodiments herein.

FIG. 2 is a flow diagram of methods utilized by embodiments herein. This embodiment of the invention determines source materials to be used when forming integrated circuit structures on a substrate 200, and evaluates the source materials to find temperatures at which the source materials may become damaged 202. A heat sensitive material, that changes color when heated, is selected based on the temperature at which the heat sensitive material will change color 204. The temperature at which the heat sensitive material will change color may coincide with the temperature at which the source material may become damaged. The substrate is formed using the heat sensitive material 206 and the substrate is subjected to heat processing to form the integrated circuit structures. The heat sensitive material permanently changes to one of a plurality of colors depending upon a maximum temperature to which the heat sensitive material is exposed, and the selection of the heat sensitive material includes choosing a heat sensitive material that changes color at a temperature that may damage the source materials. The process anticipates subjecting the substrate to heat processing to form the integrated circuit structures 210.

The substrate is then observed to determine whether the substrate has a warning color that indicates that the substrate has been exposed to a temperature above the temperature that will damage the source materials 212, and the process discards the integrated circuit if the substrate has the warning color 214. The heat sensitive materials may be positioned at a location of the substrate that is visible from the exterior of the integrated circuit structure, and may be positioned within a portion of the substrate, or within all of the substrate 208. The substrate may include an organic substrate. The method may include correlating one of the plurality of colors to a known temperature history, such that the heat sensitive material provides a visual indication of cumulative temperature exposure, thus providing a permanent record of individual component quality based on the one of the plurality of colors displayed by the heat sensitive material. The heat sensitive material may include a polydiacetylene compound that exhibits irreversible thermochromism so that the compound undergoes a change from a blue color to a red color at a selected temperature.

The embodiments presented herein allow for knowing if excessive temperature failure was induced by a manufacturing process or by a customer, and where an excessive temperature was induced (by determining if a color change has occurred in the temperature sensitive material corresponding to a predetermined threshold temperature).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of any embodiments herein. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments herein has been presented for purposes of illustration and description, but is not intended to be exhaustive or limited to the embodiments herein in the form disclosed. Many modifications and variations will be apparent to those of ordinary skill in the art without departing from the scope and spirit of the embodiments herein. The embodiment was chosen and described in order to best explain the principles of the embodiments herein and the practical application, and to enable others of ordinary skill in the art to understand the embodiments herein for various embodiments with various modifications as are suited to the particular use contemplated.

What is claimed is:

1. An integrated circuit structure comprising:
   an organic substrate; and
   circuitry connected to said organic substrate,
   said organic substrate including a heat sensitive material that changes color when a predetermined temperature is exceeded, said predetermined temperature being a temperature that causes damage to said integrated circuit structure.

2. The integrated circuit structure according to claim 1, said heat sensitive material being positioned on said organic substrate at a location that is visible from an exterior of said integrated circuit structure.

3. The integrated circuit structure according to claim 1, said heat sensitive material having one of a plurality of colors depending upon a temperature to which said organic substrate was exposed.

4. The integrated circuit structure according to claim 1, said heat sensitive material being positioned one of:
   within a portion of said organic substrate; and
   within all of said organic substrate.

5. An integrated circuit structure comprising
   an organic substrate;
   circuitry connected to said substrate; and
   a heat sensitive material within said organic substrate, said heat sensitive material including a polydiacetylene compound,
   said heat sensitive material changing color when a predetermined temperature is exceeded, said predetermined temperature being a temperature that causes damage to said integrated circuit structure.

6. The integrated circuit structure according to claim 5, said heat sensitive material being positioned on said organic substrate at a location that is visible from an exterior of said integrated circuit structure.

7. The integrated circuit structure according to claim 5, said heat sensitive material having one of a plurality of colors depending upon a temperature to which said organic substrate was exposed.

8. The integrated circuit structure according to claim 5, said heat sensitive material being positioned one of:
   within a portion of said organic substrate; and
   within all of said organic substrate.

9. A method comprising:
   determining source materials to be used when forming integrated circuit structures on a substrate;
   evaluating said source materials to find a temperature at which said source materials become damaged;
   selecting a heat sensitive material that changes color when heated to said temperature;
   forming said substrate comprising said heat sensitive material;
   subjecting said substrate to heat processing to form said integrated circuit structures:,
   following said heat processing, inspecting said substrate to determine whether said substrate has a warning color that indicates that said substrate has been exposed to said temperature; and
   discarding said integrated circuit structures if said substrate has said warning color.

10. The method according to claim 9, further comprising:
    positioning said heat sensitive material at a location of said substrate that is visible from an exterior of said integrated circuit structures.

11. The method according to claim 9, further comprising:
    positioning said heat sensitive material one of:
    within a portion of said substrate; and
    within all of said substrate.

12. The method according to claim 9, said substrate comprising an organic substrate.

13. The method according to claim 9, said heat sensitive material having one of a plurality of colors depending upon a temperature to which said substrate was exposed, said method further comprising correlating said one of said plurality of colors to a known temperature history.

14. The method according to claim 9, said heat sensitive material providing visual indication of cumulative temperature exposure.

15. The method according to claim 9, said heat sensitive material having one of a plurality of colors depending upon a temperature to which said substrate was exposed, said method further comprising:
    providing a permanent record of individual component quality based on said one of said plurality of colors.

16. The method according to claim 9, said heat sensitive material further comprising a polydiacetylene compound.

17. The method according to claim 16, said polydiacetylene compound exhibiting irreversible thermochromism so that said compound undergoes a change from a blue color to a red color at a selected temperature.

* * * * *